(12) United States Patent
Brahma et al.

(10) Patent No.: US 7,948,420 B1
(45) Date of Patent: May 24, 2011

(54) ELIMINATING THE USE OF ANTI-ALIASING FILTERS IN DIGITAL RELAYS BY OVERSAMPLING

(75) Inventors: Sukumar Brahma, Las Cruces, NM (US); Phillip De Leon, Las Cruces, NM (US); Rajesh Kavasseri, Fargo, ND (US)

(73) Assignee: Arrowhead Center, Inc., Las Cruces, NM (US)

( * ) Notice: Subject to any disclaimer, the term of this patent is extended or adjusted under 35 U.S.C. 154(b) by 55 days.

(21) Appl. No.: 12/421,815

(22) Filed: Apr. 10, 2009

Related U.S. Application Data (60) Provisional application No. 61/074,451, filed on Jun. 20, 2008.

(51) Int. Cl.
*H03M 1/12* (2006.01)

(52) U.S. Cl. ............ 341/155; 455/141; 375/346; 702/75

(58) Field of Classification Search .......... 341/121–155; 375/219, 252, 340, 346, 240.2; 700/94; 704/500; 455/141, 208; 382/269, 205, 240, 167, 232; 345/611; 359/571; 367/63, 46, 49; 348/234, 348/458, 606, 342; 324/318, 309; 333/173

See application file for complete search history.

(56) References Cited

U.S. PATENT DOCUMENTS

| | | | |
|---|---|---|---|
| 4,234,956 A | 11/1980 | Adderley et al. | |
| 4,300,182 A | 11/1981 | Schweitzer, III | |
| 4,455,612 A | 6/1984 | Girgis et al. | |
| 4,862,168 A * | 8/1989 | Beard | 341/140 |
| 4,933,675 A * | 6/1990 | Beard | 341/110 |
| 5,224,011 A | 6/1993 | Yalla et al. | |
| 5,633,633 A * | 5/1997 | Nakano | 341/61 |
| 5,671,112 A | 9/1997 | Hy et al. | |
| 5,721,689 A | 2/1998 | Hart et al. | |
| 5,742,156 A | 4/1998 | Sezi | |
| 5,805,395 A | 9/1998 | Hu et al. | |
| 5,822,165 A | 10/1998 | Moran | |
| 5,832,413 A | 11/1998 | Benco et al. | |
| 5,832,414 A | 11/1998 | Hart et al. | |
| 6,618,711 B1 | 9/2003 | Ananth | |
| 6,801,145 B2 * | 10/2004 | Asami | 341/118 |

(Continued)

FOREIGN PATENT DOCUMENTS

WO WO 97/16738 5/1997

OTHER PUBLICATIONS

Orphandis, Sophocles J., *Introduction to Signal Processing* Prentice-Hall, Inc., Englewood Cliffs, N.J. 1996, 63-67.

(Continued)

*Primary Examiner* — Lam T Mai
(74) *Attorney, Agent, or Firm* — Jeffrey D. Myers; Peacock Myers, P.C.

(57) ABSTRACT

A digital relay and concomitant method comprising employing an analog-to-digital converter, and via control logic providing oversampled output of the converter to determine likely digital values corresponding to the output, and wherein the control logic substantially eliminates aliasing resulting from waveform transients in input to the converter, and wherein no anti-aliasing filter is employed providing the input. Also, a digital relay and concomitant method comprising employing an analog-to-digital converter, and via control logic providing oversampled output of the converter to determine via Fourier transform likely digital values corresponding to the output, and wherein the control logic substantially eliminates aliasing resulting from waveform transients in input to the converter.

10 Claims, 6 Drawing Sheets

U.S. PATENT DOCUMENTS

| | | | |
|---|---|---|---|
| 6,809,668 B2 * | 10/2004 | Asami | 341/120 |
| 6,856,925 B2 * | 2/2005 | Muhammad et al. | 702/75 |
| 7,057,537 B2 * | 6/2006 | Lee et al. | 341/61 |
| 7,103,489 B2 * | 9/2006 | Muhammad et al. | 702/75 |
| 7,212,139 B1 * | 5/2007 | Katz | 341/123 |
| 7,373,119 B2 * | 5/2008 | Petersson et al. | 455/141 |
| 7,375,664 B2 * | 5/2008 | Bilhan | 341/122 |
| 7,466,777 B2 * | 12/2008 | Muhammad et al. | 375/346 |
| 7,647,192 B2 * | 1/2010 | Muhammad et al. | 702/75 |
| 7,692,570 B2 * | 4/2010 | Martellock et al. | 341/155 |
| 2003/0083852 A1 * | 5/2003 | Muhammad et al. | 702/190 |
| 2003/0171100 A1 * | 9/2003 | Petersson et al. | 455/141 |
| 2004/0027750 A1 | 2/2004 | Minami et al. | |

OTHER PUBLICATIONS

McLaren, P. G. et al., "Software Models for Relays", *IEEE Transactions on Power Delivery* vol. 16, No. 2 Apr. 2001, 238-245.

\* cited by examiner

ELIMINATING THE USE OF ANTI-ALIASING FILTERS IN DIGITAL RELAYS BY OVERSAMPLING

CROSS-REFERENCE TO RELATED APPLICATIONS

This application claims priority to and the benefit of the filing of U.S. Provisional Patent Application Ser. No. 61/074,451, entitled "Eliminating the Use of Anti-Aliasing Filters in Digital Relays by Oversampling", filed on Jun. 20, 2008, and the specification and claims thereof are incorporated herein by reference.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

Embodiments of the present invention relate to eliminating the need for anti-aliasing filters in digital relays by use of oversampling.

2. Description of Related Art

Digital relays use sampling rates ranging from 8 samples/cycle to as high as 96 samples/cycle (in any case, less than 100 samples/cycle). During the inception of a fault, the voltage and current waveforms are superimposed by transients. The amount and duration of transients depend on factors like the instant of fault with respect to the voltage waveform, the type of fault, the location of fault on the line, and the damping available in the system. Faults occurring at instants when the voltage waveform is around its peak value are the most severe in terms of transients. Typically, voltage waveforms experience more severe transients than current waveforms. Digital relays use the discrete Fourier transform (DFT) of the sampled signal to estimate the phasor value of the fundamental. To avoid aliasing, especially during a fault, all digital relays employ an analog (low-pass) anti-aliasing filter before sampling the voltages and currents with a analog-to-digital converter (ADC). Such a filter introduces a time-delay of 1.5-2 ms in the phasor estimation depending on the sampling rate chosen. Such a filter can also be relatively expensive.

In many applications, oversampling, i.e., $f_s \gg 2f_n$ where $f_s$ and $f_n$ are the sampling and Nyquist frequencies respectively has long been used to simplify the requirement of an anti-aliasing filter with a sharp cutoff at $f_n$. If the oversampling rate is selected such that any aliased frequencies are extremely small or below the noise floor, then the anti-aliasing filter can be made less sharp or in some cases even be eliminated, reducing cost and delay. Many commonly-available ADCs utilize oversampling for these reasons.

Very inexpensive ADC chips are currently available that use oversampling up to a few hundred kHz. Digital music industry today is able to produce excellent sound re-production by using very simple or no analog pre-filtering in their products. Since adopting inexpensive oversampling can eliminate comparatively more expensive analog filter and the associated time-delay, it is worthwhile to investigate the possibility of removing anti-aliasing filters from digital relays through oversampling.

Power System Relaying Committee Report, "Software models for relays," published in IEEE Trans. Power Delivery, vol. 16, no. 2, pp. 238-245, April 2001, indicates that oversampling is used in the newest generation of relays, but the main purpose of oversampling is oscillography. These relays still use an analog anti-aliasing filter and the sampling rate used for phasor estimation is obtained by decimating the data sampled at higher frequency.

There is thus value and a need for a method and apparatus which facilitates the manufacturing of a digital relay that does not require an analog anti-aliasing filter.

BRIEF SUMMARY OF THE INVENTION

The present invention is of a digital relay and concomitant method comprising: employing an analog-to-digital converter; and via control logic providing oversampled output of the converter to determine likely digital values corresponding to the output; and wherein the control logic substantially eliminates aliasing resulting from waveform transients in input to the converter; and wherein no anti-aliasing filter is employed providing the input. In the preferred embodiment, the control logic oversamples at least about 18 kHz, more preferably at least about 40 kHz, and alternatively at least about 48 kHz or at 40 kHz.

The invention is additionally of a digital relay and concomitant method comprising: employing an analog-to-digital converter; and via control logic providing oversampled output of the converter to determine via Fourier transform likely digital values corresponding to the output; and wherein the control logic substantially eliminates aliasing resulting from waveform transients in input to the converter. In the preferred embodiment, the control logic oversamples at least about 18 kHz, more preferably at least about 40 kHz, and alternatively at least about 48 kHz or at 40 kHz.

Further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIG. 1(b) is an illustrative graph of the spectral energy in the waveform shown in

FIG. 1(a);

DETAILED DESCRIPTION OF THE INVENTION

Figure 6:
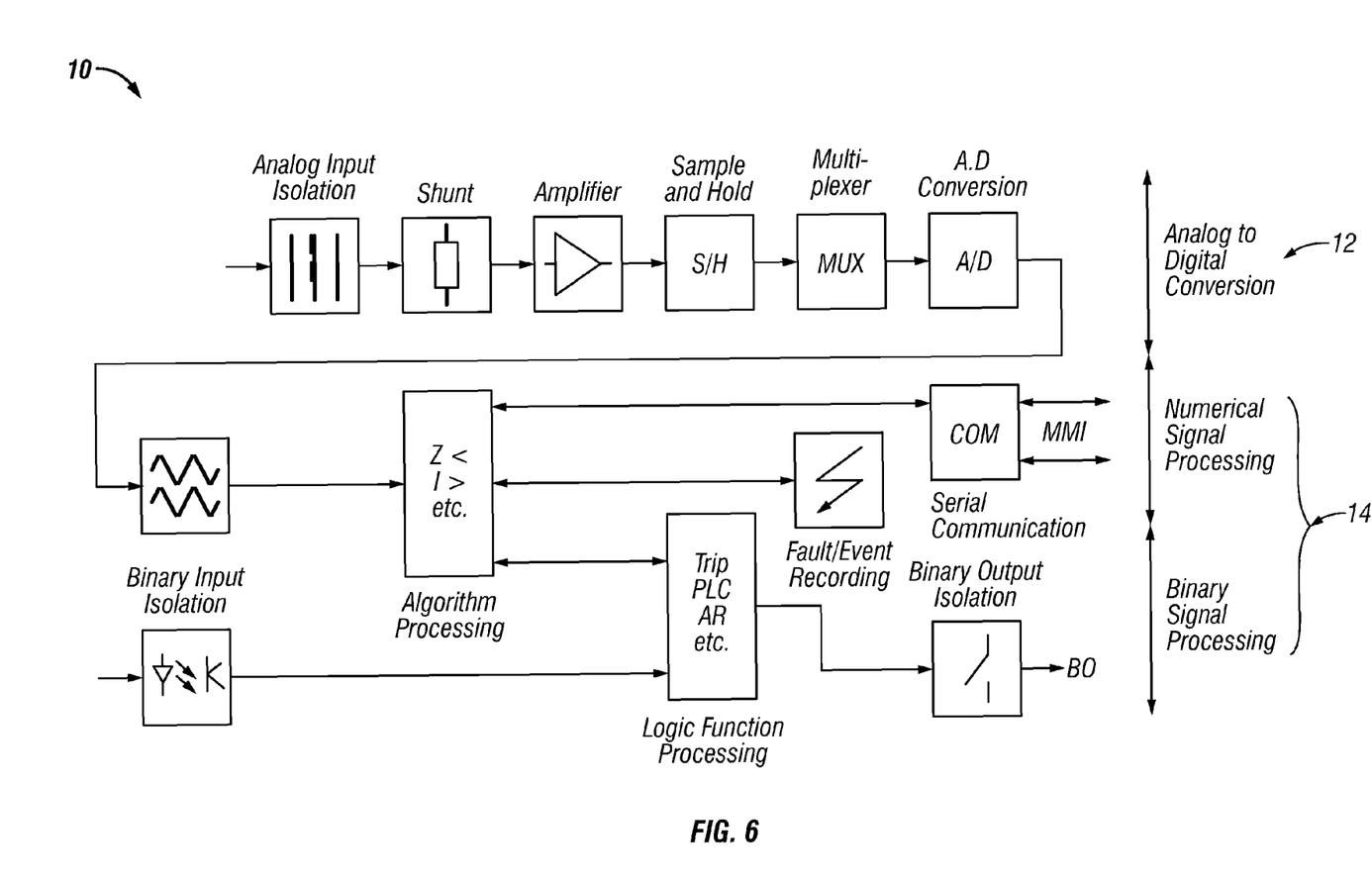
FIG. 6 is a schematic diagram of a digital relay according to the invention.

Embodiments of the present invention comprise an apparatus and method for determining and applying a preferred oversampling rate for which the phasor-estimates without using an anti-aliasing filter are practically the same as the phasor-estimates from a conventional digital relay that uses an anti-aliasing filter. FIG. 6 shows the preferred digital relay 10 of the invention, comprising an ADC 12 and control logic 14 (providing oversampling), and lacking an anti-aliasing filter preceding the ADC. The control logic can be implemented in any appropriate hardware/software/firmware combination, including those employing microprocessor-based solutions, application specific integrated circuits (ASICs), field-programmable gate arrays (FPGAs), and the like.

The preferred oversampling rate is chosen after careful study of the spectral content of a typical voltage waveform after a fault. The preferred sampling rate is tested on a comprehensive array of fault waveforms generated using Electromagnetic Transient Program (EMTP). Through such trials, one sees that the phasor estimates using the preferred oversampling rate and without using an anti-aliasing filter are practically the same as the phasor estimates from a conventional digital relay that uses an anti-aliasing filter. Factors like fault type, fault location, fault instant, fault resistance and pre-fault conditions are varied while generating the fault waveforms to cover a wide range of fault-transients to thoroughly test the present invention.

The test results below show that a sampling rate of 48 kHz gives satisfactory performance for all waveforms tested. Sampling rates higher than 48 kHz will also give satisfactory performance. Sampling rates lower than 48 kHz may also give satisfactory performance if the spectral content at such sampling rate is well below the quantization error of ADC.

In a preferred embodiment, the relay comprises an apparatus and method which: eliminates anti-aliasing filters by oversampling; applies ND (analog/digital) conversion processes to the incoming voltages and currents; analyzes the ND converter output to extract, as a minimum, magnitude of the incoming quantity, most preferably using Fourier transform concepts (RMS and some form of averaging are used in basic products), the Fourier transform can be used to extract the signal's phase angle relative to some reference, except in the most basic of applications; is capable of applying advanced logic for analyzing whether the relay should trip or refrain from tripping based on current and/or voltage magnitude (and angle in some applications), complex parameters set by the user, relay contact inputs, and in some applications, the timing and order of event sequences; uses logic that is user-configurable at a level well beyond simply changing front panel switches or moving of jumpers on a circuit board; has some form of advanced event recording, the event recording can include some means for the user to see the timing of key logic decisions, relay I/O (input/output) changes, and see in an oscillographic fashion at least the fundamental frequency component of the incoming ac waveform; has an extensive collection of settings, beyond what can be entered via front panel knobs and dials, and these settings can be transferred to the relay via an interface with a personal computer, and this same personal computer interface is used to collect event reports from the relay; and/or optionally contains advanced metering and communication protocol ports, allowing the relay to become a focal point in a supervisory control and data acquisition system. Furthermore, the invention brings down the cost of present-day digital relays without affecting their performance and reduces the size of the present-day digital relays without affecting their performance.

In a preferred embodiment, oversampling in digital relays reduces cost and delay imposed by an analog anti-aliasing filter. An oversampling rate can be determined that is suitable to replicate the performance of a traditional relay but does not require an anti-aliasing filter. By utilizing oversampling, low-cost digital filters may optionally be applied which may potentially eliminate or reduce the decaying dc offset in fault-current waveforms more effectively compared to the anti-aliasing low-pass filters; thereby improving the DFT estimates of fault currents.

In one embodiment, the present invention does not require performing the DFT after every new sample enters the data-window. At a preferred rate of one embodiment, that would mean 800 phasor-estimates per cycle, which is not necessary. The results illustrated and further described below, were obtained by performing DFT only 16 times per cycle, just like a traditional relay. However, the data-window with a preferred method has 800 samples as compared to up to 100 samples in a traditional relay. With current digital hardware technologies, the increased window size does not represent any significant cost increase or calculation burden. Thus, there is no significant extra burden on the microprocessor, or increase in processing time, or increase in cost according to an embodiment of the present invention.

INDUSTRIAL APPLICABILITY

The invention is further exemplified by the following illustrations of simulations of electrical power transmission lines using differing variables for fault conditions and sampling rates.

In order to obtain a preliminary estimate of the required sampling rate to avoid aliasing, the spectral content of the sampled waveform should be measured. In order to perform such spectral analysis, a fault-voltage waveform was obtained using EMTP simulation. A 240-kV, 225-km, two-terminal transmission line with substantially different source impedances at both ends was simulated on PSCAD/EMTDC® software using the long transmission line model. PSCAD/EMTDC is a time-tested graphical user interface for EMTP® with added components, and is a product of Manitoba HVDC Research Centre Inc., 244 Cree Crescent, Winnipeg, Manitoba, Canada, R3J 3W1. The parameters of the test system are given here:

Transmission Line—225 kM long:
Positive sequence impedance: 0.0358+j0.4918 Ω/km
Zero sequence impedance: 0.352+j1.3456 Ω/km
Positive sequence capacitive susceptance: 6.841 µS/km
Zero sequence capacitive susceptance: 4.24 µS/km
Sending End Source:
Positive sequence impedance: 5+j27.7095Ω
Zero sequence impedance: 10.5+j56.55Ω
Receiving End Source:
Positive sequence impedance: 0.6+j9.3119Ω
Zero sequence impedance: 1.3+j18.85Ω

Figure 1A:
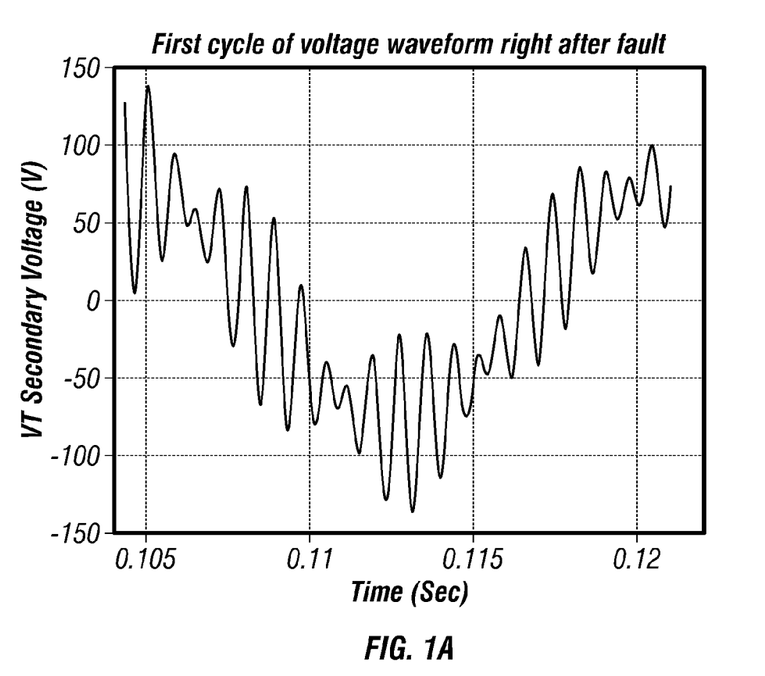
FIG. 1(a) is an illustrative graph of one cycle of A-phase voltage waveform right after a simulated fault between phase A and ground on a simulated transmission line, using a sampling rate of 96 kHz.
Figure 1B:
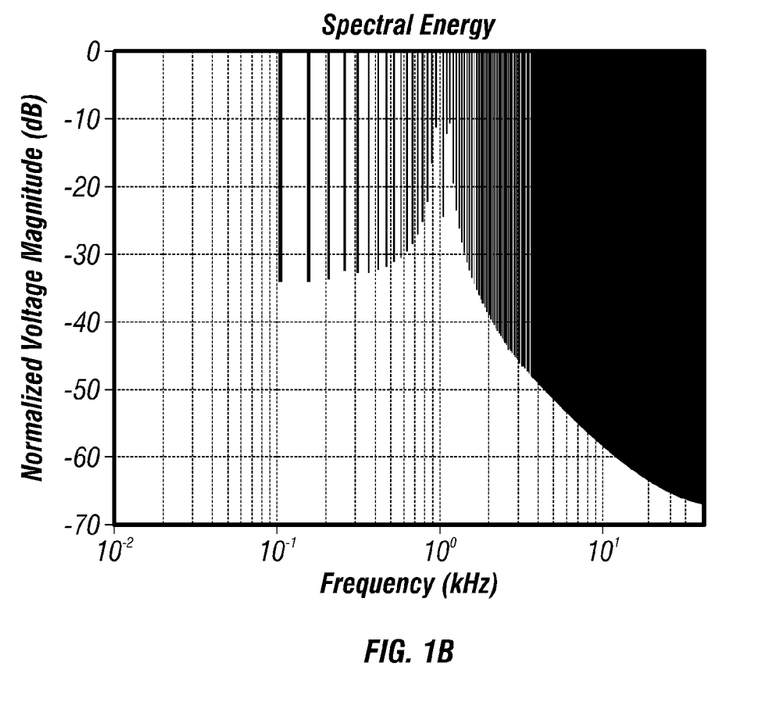

Load condition was created by a phase angle difference of 15° between the two ends. A line to ground fault on phase "A" was simulated 50 kM from one end, when the A-phase voltage was around its peak. This fault-instant ensures severe transients in the voltage waveform. The A-phase voltage waveform was sampled at an extremely high rate of 96 kHz (1600 samples/cycle) using an appropriate time-step in the simulation. This waveform and its spectral analysis for the first cycle after the fault is shown in FIGS. 1(a) and (b) respectively. The fault instant is 0.1024 seconds in the simulation. FIG. 1(b) shows the normalized voltage magnitude in dB on the Y-axis and the frequency (log-scale) on the X-axis. This means, as can be seen in FIG. 1(b), that the fundamental component (60 Hz) of the voltage waveform has 0 dB magnitude. This form of display provides better comparison of the energy in the harmonics and the energy in the fundamental.

The Nyquist rate for the selected sampling rate of 96 kHz is 48 kHz. FIG. 1(b) shows the spectral energy up to 48 kHz. If one assumes an 8-bit ADC, the quantization noise level can be approximated as 8×6=48 dB, as explained in S. Orphanidis, *Introduction to Signal Processing*, Prentice-Hall, 1996. It can be observed that the signal-energy at the frequency of approximately 5 kHz and beyond is below this quantization noise floor for the waveform analyzed. Beyond 20 kHz, the signal energy drops to a very low value. Based on this observation, an oversampling rate of around 2×20=40 kHz should suffice. However, since $f_s$=48 kHz is a standard sampling rate in audio applications for which very low cost ADCs are widely available, an oversampling rate of 48 kHz was selected. With this sampling rate, the harmonics beyond 24 kHz will be aliased. Clearly, from FIG. 1(b), such harmonics are almost non-existent.

Based on the above rationale, a variety of fault-voltage waveforms were analyzed using the following methods:

1. As mentioned before, a traditional relay receives samples at its designed sampling rate (16 samples/cycle, or 960 Hz is considered in this example). The analog waveform, therefore, needs to be filtered to avoid aliasing. For a sampling rate of 960 Hz, the cut-off frequency of the low-pass anti-aliasing filter needs to be 480 Hz or lower. An alternate method was employed to model the traditional relay, namely that digital waveforms were created using an extremely high sampling rate of 96 kHz (1600 samples/cycle) by selecting an appropriate time-step in the simulation. This would ensure practically zero aliasing as indicated in FIG. 1(b). These waveform-samples were digitally filtered using a second-order Butterworth low-pass filter with a cut-off frequency of 240 Hz, downsampled to 16 samples/cycle, and processed with DFT to estimate the phasor value of the fundamental. This process effectively models the traditional relay using an analog second-order Butterworth anti-aliasing filter with cut-off frequency of 240 Hz, and using $f_s$=960 Hz. Cut-off frequency lower than $f_s/2$=480 Hz was chosen because the second-order filter does not have a very sharp cut-off.

2. Waveform was oversampled at $f_s$=48 kHz and directly processed with the DFT—no anti-aliasing filter was assumed. This models the approach of the invention.

In one embodiment, if the input waveforms were sufficiently oversampled (greater than Nyquist rate), the requirement of the antialiasing filter could be eliminated. In a preferred embodiment, the performance of a traditional digital relay was compared with the performance of the preferred method by using a comprehensive array of simulated test-waveforms. The simulated waveforms were generated with PSCAD/EMTDC® software, product of Manitoba HVDC Research Centre Inc., 244 Cree Crescent, Winnipeg, Manitoba, Canada, R3J 3W1, which is widely used time-tested software for power system analysis. Factors like fault type, fault location, fault instant, fault resistance and pre-fault conditions were varied while generating the fault waveforms to cover a wide range of fault-transients to thoroughly test the method of the invention. These waveforms were processed with the coded models of both, the traditional digital relay and the preferred method of the invention. It was illustrated that the results using both methods were practically the same, according to one embodiment of the present invention, the preferred method could be used to reduce the cost and size of digital relays currently manufactured by getting rid of the analog anti-aliasing filter and using very inexpensive oversampling techniques.

Example 1

Figure 2A:
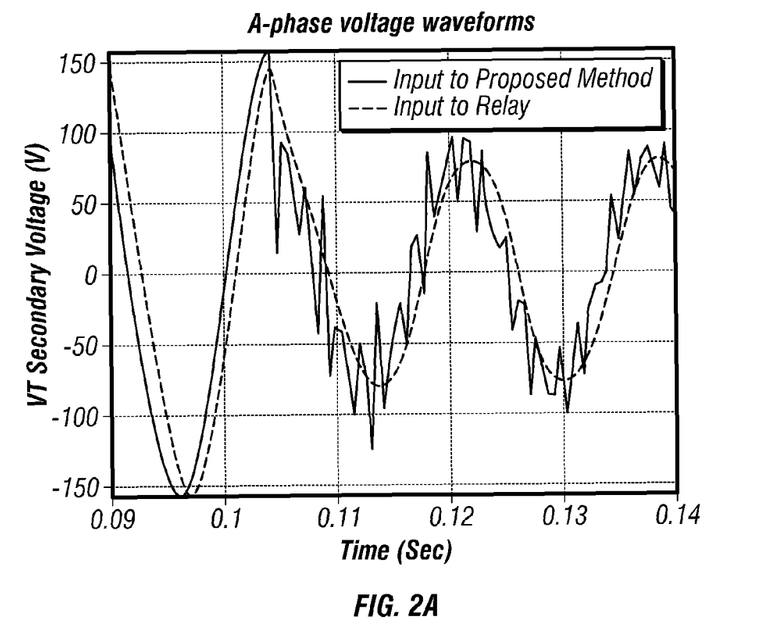
FIG. 2(a) is an illustrative graph of A-phase voltage waveforms before and after a simulated fault between phase A and ground on a simulated transmission line. The dotted waveform is obtained by sampling the voltage waveform at 96 kHz, filtering the waveform with low-pass digital anti-aliasing filter with a cut-off frequency of 240 Hz, and then downsampling the resulting waveform to 16 samples per cycle, while the solid waveform is obtained by using a sampling rate of 1.92 kHz and without using any filtering.
Figure 2B:
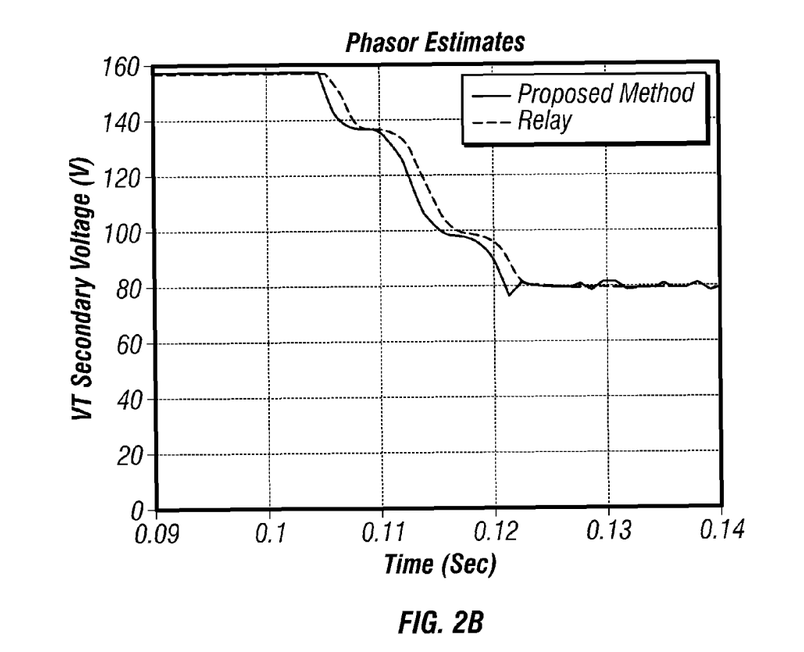
FIG. 2(b) is an illustrative graph of phasor estimation of the two waveforms shown in FIG. 2(a), by means of DFT. The dotted line corresponds to the phasor estimation by a traditional digital relay, while the solid line shows the phasor estimation using an embodiment of the present invention.

A non-limiting example of a system which models a 240-kV, 225-km, two-terminal transmission line having substantially different source impedances at both ends was simulated on PSCAD/EMTDC® using the long transmission line model. A load condition was created by a phase angle difference of 15° between the two ends. A line to ground fault on phase A was simulated 50 kM from one end, when the A phase voltage was around its peak. This fault-instant ensured severe transients in the voltage waveform. First, to illustrate the effect of aliasing on the phasor estimates, 2×oversampling was selected, i.e., $f_s$=2×960 Hz=1.92 kHz. With this sampling rate, FIG. 2(a) shows the input waveforms to the relay (filtered) and to the method of the invention (unfiltered), and FIG. 2(b) shows the phasor estimates; both referred to the secondary of the voltage transformer (VT). There is obvious discrepancy in the phasor estimates. This is attributed to the fact that FIG. 1(b) shows substantial signal energy above $1.92/2$=0.96 kHz.

Example 2

Figure 3A:
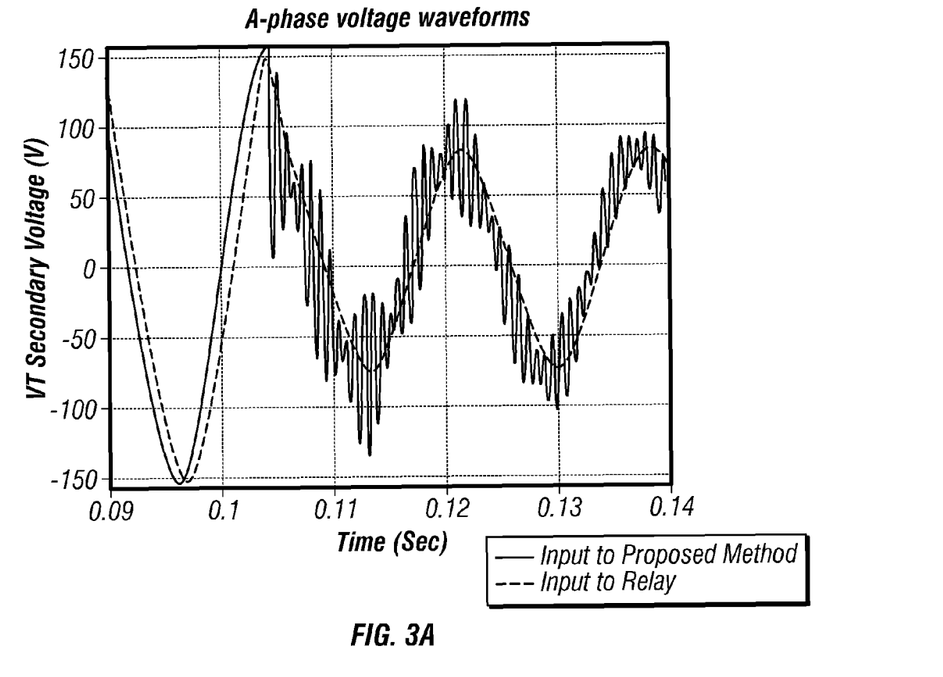
FIG. 3(a) is an illustrative graph of A-phase voltage waveforms before and after a simulated fault between phase A and ground on a simulated transmission line. The dotted waveform is obtained by sampling the voltage waveform at 96 kHz, filtering the waveform with low-pass digital anti-aliasing filter with a cut-off frequency of 240 Hz, and then downsampling the resulting waveform to 16 samples per cycle, while the solid waveform is obtained by using a sampling rate of 48 kHz and without using any filtering.
Figure 3B:
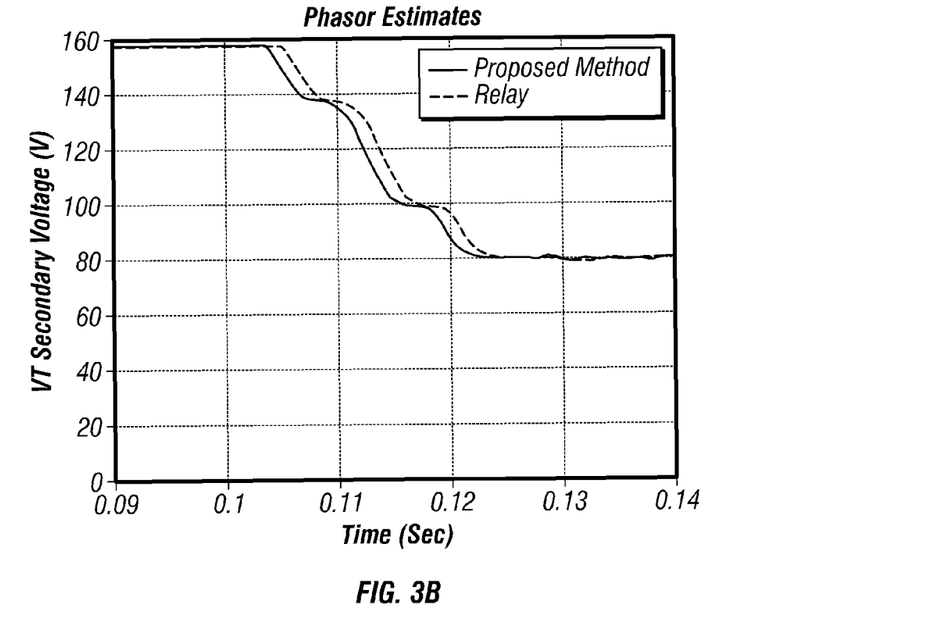
FIG. 3(b) is an illustrative graph of phasor estimation of the two waveforms shown in FIG. 3(a), by means of DFT. The dotted line corresponds to the phasor estimation by a traditional digital relay, while the solid line shows the phasor estimation using a preferred embodiment of the present invention.

The fault waveform was now sampled at the preferred sampling rate of 48 kHz. FIG. 3(a) shows the input waveforms to the relay (filtered) and to the method of the invention (unfiltered), and FIG. 3(b) shows the phasor estimates; both referred to the secondary of the voltage transformer (VT). The phasor estimates are practically the same, except for the one-cycle transition period from the pre-fault to fault condition. It can also be observed that the phasor estimation using the method of the invention was faster, as it avoided the delay associated with the anti-aliasing filter.

Figure 4A:
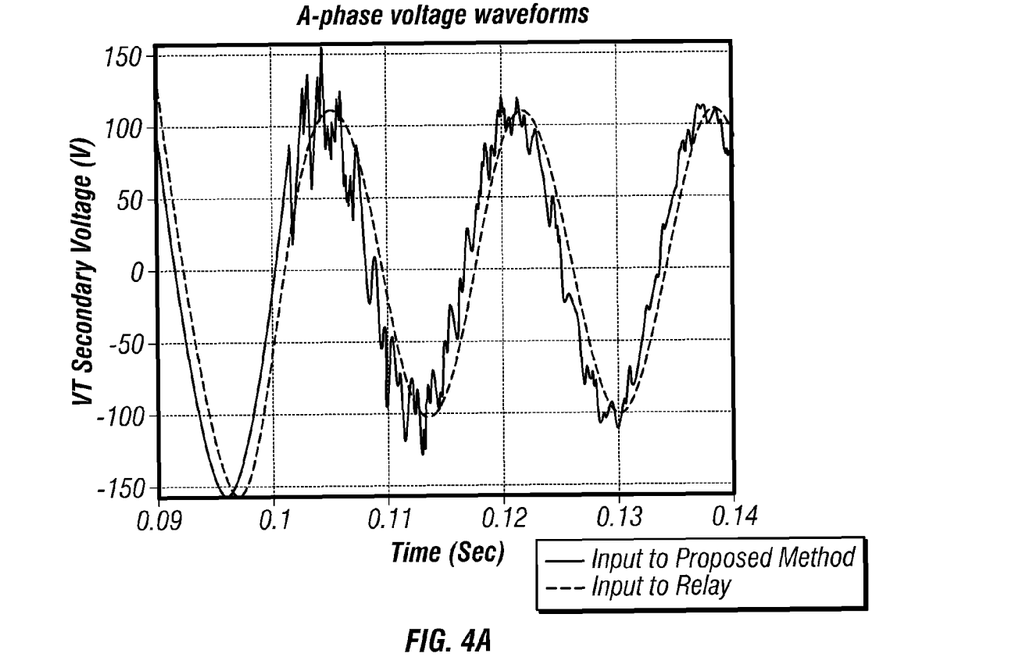
FIG. 4 is an illustrative graph of phasor estimation with a traditional relay and with the method of the invention for LGF at 100 kM from sending end, the implementation details being similar to those of FIGS. 3(a) and 3(b)
Figure 4B:
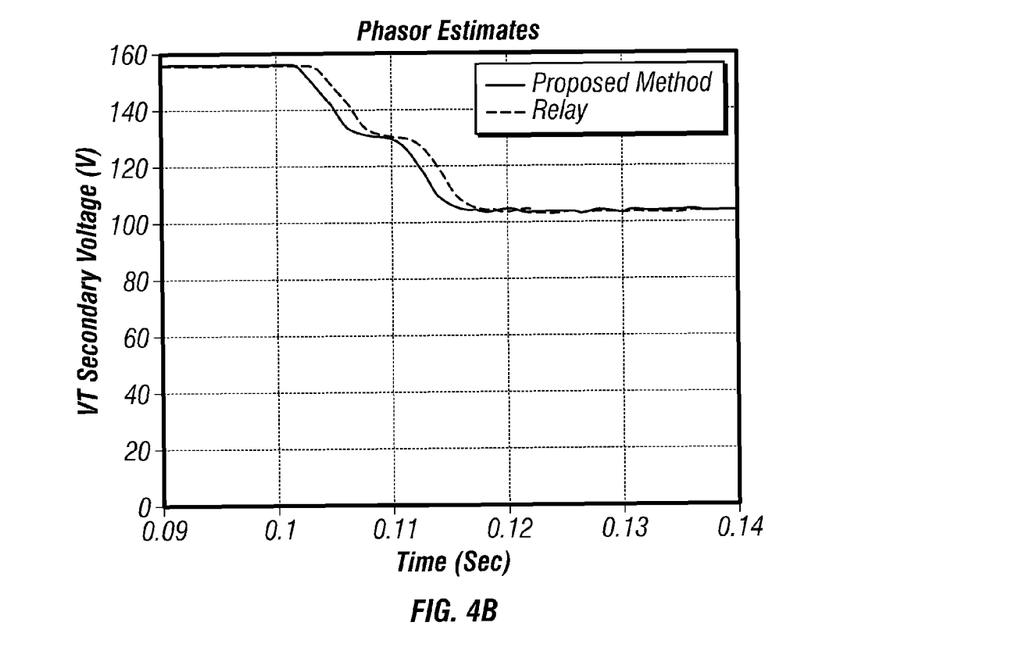
Figure 5A:
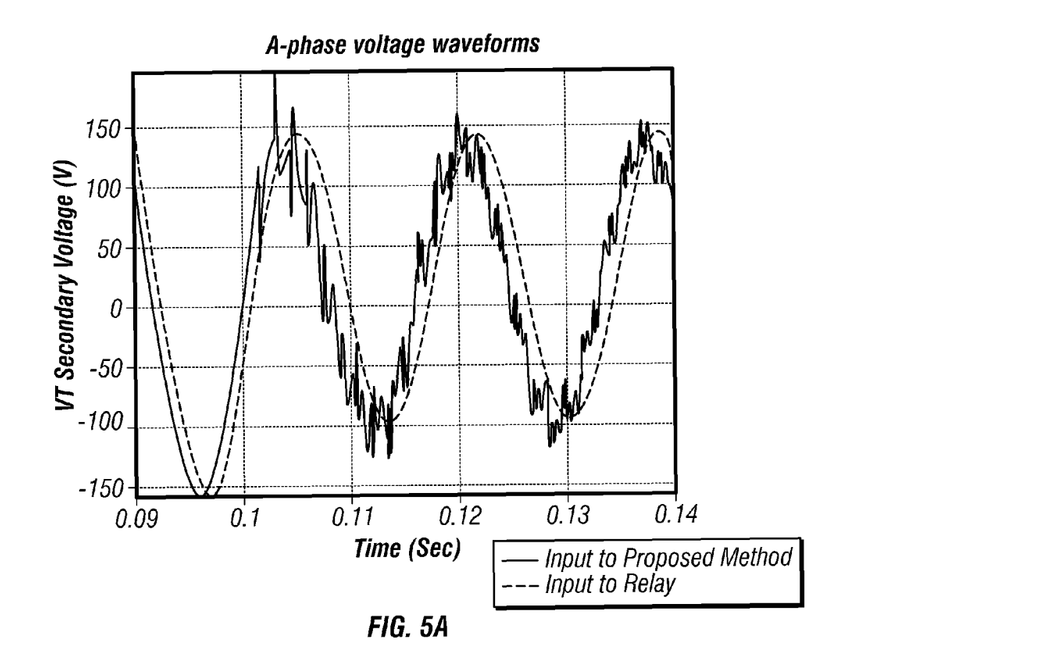
FIG. 5 is an illustrative graph of phasor estimation with a traditional relay and with the method of the invention for LLLF at 150 kM from sending end, the implementation details being similar to those of FIGS. 3(a) and 3(b)
Figure 5B:
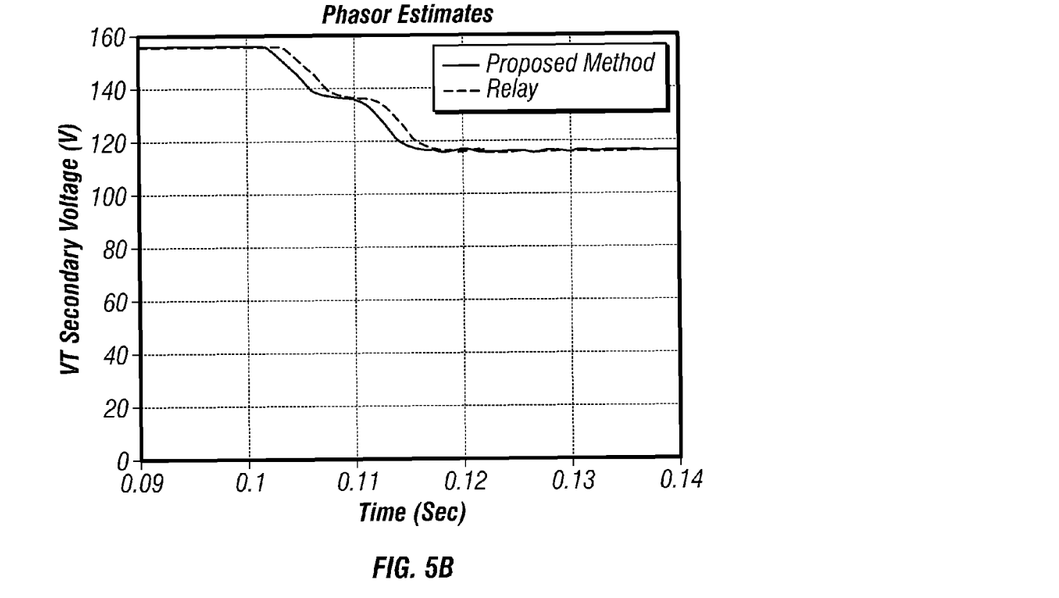

The transient content in a fault waveform can vary with the fault location, fault instant, fault type, pre-fault conditions and fault resistance. Therefore, it is important to test the preferred sampling rate with respect to these various conditions. Therefore, the sampling rate of 48 kHz was applied to voltage waveforms corresponding to such conditions, and was found to provide practically the same phasor estimates as from the traditional relay. Each type of fault (LLL, LL, LG, LLG) was created at 5%, 50%, and 95% distance from the sending end of the simulated transmission line. Each fault was created at near zero-crossing of the voltage waveform, around the peak of the waveform, and at an instant half-way between. Fault resistances up to 50Ω were considered for faults involving ground, and up to 10Ω for other types. FIG. 4 shows the results for a LG fault at 100 kM from the sending end. FIG. 5 shows the results for a LLL fault at 150 kM from the sending end. Both of these faults take place at a point between the zero-crossing and the peak of the voltage waveform. The LLL fault was created with a pre-fault angle difference between two ends of the transmission line being 18 degrees. It was observed that $f_s$=48 kHz gave satisfactory results for all the cases tested.

Some lower sampling rates also gave good results. This is evidenced by the fact that the signal energy is less than –60 dB for frequencies beyond approximately 13 kHz for the signal analyzed in FIGS. 1(a) and (b). However, $f_s$=48 kHz was selected to include a safety margin. In addition, this is a standard sampling rate in audio applications for which very low cost ADCs are widely available.

The preceding examples can be repeated with similar success by substituting the generically or specifically described reactants and/or operating conditions of this invention for those used in the preceding examples.

Note that in the specification and claims, "about" or "approximately" means within twenty percent (20%) of the numerical amount cited.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A digital relay comprising:
    an analog-to-digital converter; and
    control logic providing oversampled output of said converter, sampled once at higher than the Nyquist rate and without decimation, to determine likely digital values corresponding to said output; and
    wherein said control logic substantially eliminates aliasing resulting from waveform transients in input to said converter; and
    wherein no anti-aliasing filter is employed providing the input.

2. The digital relay of claim 1 wherein said control logic oversamples at least about 18 kHz.

3. The digital relay of claim 2 wherein said control logic oversamples at least about 40 kHz.

4. The digital relay of claim 3 wherein said control logic oversamples at least about 48 kHz.

5. The digital relay of claim 3 wherein said control logic oversamples at 40 kHz.

6. A digital relay method comprising:
    employing an analog-to-digital converter; and
    via control logic providing oversampled output of the converter, sampled once at higher than the Nyquist rate and without decimation, to determine likely digital values corresponding to the output; and
    wherein the control logic substantially eliminates aliasing resulting from waveform transients in input to the converter; and
    wherein no anti-aliasing filter is employed providing the input.

7. The digital relay method of claim 6 wherein the control logic oversamples at at least about 18 kHz.

8. The digital relay method of claim 7 wherein the control logic oversamples at at least about 40 kHz.

9. The digital relay method of claim 8 wherein the control logic oversamples at at least about 48 kHz.

10. The digital relay method of claim 8 wherein the control logic oversamples at 40 kHz.

* * * * *